United States Patent
Hoshino et al.

(10) Patent No.: US 6,801,065 B2
(45) Date of Patent: Oct. 5, 2004

(54) TRANSISTOR OUTPUT CIRCUIT, SEMICONDUCTOR DEVICE INCLUDING TRANSISTOR OUTPUT CIRCUIT, AND SWITCHING ELECTRIC POWER UNIT HAVING TRANSISTOR OUTPUT CIRCUIT

(75) Inventors: Taichi Hoshino, Kyoto (JP); Ryouma Matsuo, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 0 days.

(21) Appl. No.: 10/658,485

(22) Filed: Sep. 8, 2003

(65) Prior Publication Data

US 2004/0051568 A1 Mar. 18, 2004

(30) Foreign Application Priority Data

Sep. 12, 2002 (JP) ........................................ 2002-266463

(51) Int. Cl.[7] ................................................ H03K 3/00
(52) U.S. Cl. ........................................ 327/112; 326/84
(58) Field of Search ................................ 327/108, 112, 327/432, 433, 478, 484; 326/82–85, 89, 110

(56) References Cited

U.S. PATENT DOCUMENTS

| | | | | |
|---|---|---|---|---|
| 4,751,410 A | * | 6/1988 | Tanizawa | 326/32 |
| 5,097,150 A | * | 3/1992 | Satou et al. | 326/110 |
| 5,191,240 A | * | 3/1993 | Fleischer | 326/84 |
| 5,365,124 A | * | 11/1994 | Seta et al. | 326/110 |
| 5,371,423 A | * | 12/1994 | Berthold et al. | 326/57 |
| 5,446,321 A | * | 8/1995 | Yoshino et al. | 326/57 |

FOREIGN PATENT DOCUMENTS

JP          B-3028840          2/2000

* cited by examiner

*Primary Examiner*—My-Trang Nu Ton
(74) *Attorney, Agent, or Firm*—Merchant & Gould P.C.

(57) ABSTRACT

A main driver, in which NPN and PNP bipolar transistors are connected in series, is driven by an output of a pre-driver having a first CMOS circuit driven by an input signal. An assist circuit having a second CMOS circuit driven by the input signal and also having a current limit resistor is provided, and an output of the main driver is assisted by an output of the assist circuit. Therefore, it is possible to reduce a short circuit current in a transistor output circuit, to increase and decrease an output signal to an power-supply potential (upper limit) and a ground potential (lower limit), and to smoothly change the output signal near the power-supply potential and the ground potential. Further, an intensity of electromagnetic noise is reduced and a switching output having a sufficiently large amplitude is supplied.

7 Claims, 4 Drawing Sheets

TRANSISTOR OUTPUT CIRCUIT, SEMICONDUCTOR DEVICE INCLUDING TRANSISTOR OUTPUT CIRCUIT, AND SWITCHING ELECTRIC POWER UNIT HAVING TRANSISTOR OUTPUT CIRCUIT

BACKGROUND OF THE INVENTION

1. Field of the Invention

The present invention relates to a transistor output circuit for driving an output device according to an input signal, a semiconductor device having the transistor output circuit and a switching electric power unit having the transistor output circuit.

2. Description of the Related Art

Various types of switching electric power units are conventionally used for electronic devices, which require another voltage except for power-supply voltage, such as digital cameras, PC, PDA, cellular phones, motor drivers and so forth.

FIG. 5 is a view showing a conventional example of the constitution of a main circuit section 20 of a switching electric power unit and a transistor output circuit (driver) 30 for driving the main circuit section 20. FIG. 6 is timing chart of drive signals.

In this switching electric power unit, a high voltage can be obtained when energy is accumulated in and discharged from a inductor $L_o$ by turning on and off a control transistor $Q_o$. The obtained high voltage is rectified by a diode $D_o$ and smoothed by a capacitor $C_o$, so that DC output voltage $V_o$ can be obtained.

For example, an input signal $S_{in}$ such as PWM control signal is inputted into the driver 30, and an output signal $S_{out}$ for turning on and off the control transistor $Q_o$ is outputted from the driver 30. The driver 30 includes a CMOS (Complementary MOS) circuit, in which a P-type MOSFET (hereinafter, PMOS) Q1 and an N-type MOSFET (hereinafter, NMOS) Q2 are directly connected to output the output signal $S_{out}$, a drive signal generating circuit 31 for turning on and off the CMOS circuit according to the input signal $S_{in}$, and inverters INV 1 to INV 4.

In order to eliminate or reduce a short circuit current generated at the time of changing between ON and OFF in CMOS circuit, it is necessary to shift a generation timing of a positive side drive signal $P_g$ for driving the PMOS Q1 and a generation timing of a negative side drive signal $N_g$ for driving the NMOS Q2. Therefore, as shown in FIG. 6, the width of the positive side drive signal $P_g$ is extended to off-delay with respect to the width of the input signal $S_{in}$, and the width of the negative side drive signal $N_g$ is reduced to on-delay, so that off-period $T_d$ while both the PMOS Q1 and the NMOS Q2 are turned off is formed so as to reduce the short circuit current.

Although it is not a driver of the switching electric power unit, there is provided a compound circuit in which an NPN-type bipolar transistor for pull-up (hereinafter, NPN transistor) and a PNP-type bipolar transistor for pull-down (hereinafter, PNP transistor) are connected to the electric power unit in series and these NPN and PNP transistors are driven by CMOS circuit (for example, JP-B-3026840).

Japanese Patent No.3028840 (Right column of page 3, FIG. 30) is known as related reference.

However, in the case where the frequency of the input signal $S_{in}$ is low (for example, about 500 kHz), even when a sufficiently long off-period $T_d$ is provided like the conventional case shown in FIG. 5, problems are seldom caused. However, operating frequency of a switching electric power unit has been recently increased according to the demand of reducing the sizes of parts to be used. When the off-period $T_d$ is shortened in order to meet the demand, an intensity of the short circuit current is increased. Further, an output voltage of CMOS circuit is suddenly varied to an upper and a lower limit in both cases of rising and falling, and the switching wave-form becomes a substantial square wave-form. Due to the increase in the short circuit current and the square switching wave-form, electromagnetic noise increases in respect of EMI (ElectroMagnetic Interference).

In the circuit described in Japanese Patent No.3028840, a short circuit current, the intensity of which corresponds to the driving capacity, flows in CMOS circuit to drive NPN and PNP. The output signal $S_{out}$ to be outputted is limited by voltage $V_f$ between base and emitter (about 0.6 to 0.7 [V]) of NPN transistor and PNP transistor. The voltage of the output signal $S_{out}$ rises to only a potential that is lower than the power-supply voltage by voltage $V_f$. In the same manner, the output signal $S_{out}$ falls to only a potential higher than the power-supply voltage by voltage $V_f$.

Therefore, a transistor switch driven by output signal $S_{out}$ can not be completely turned off, so that a leakage current flows to generate a loss. Further, there is a possibility that the performance of a load device (for example, the main circuit of the switching electric power unit) is deteriorated. Furthermore, as a switching wave-form of the output voltage is also a square wave-form, electromagnetic noise increases.

SUMMARY OF THE INVENTION

The object of the present invention is to provide a transistor output circuit that enables to reduce electromagnetic noise and provides a switching output signal which has a sufficiently large amplitude by remarkably reducing the short circuit current, increasing/ decreasing an output signal to the power-supply potential/the ground potential, and smoothly changing in the proximity of the power-supply potential and the ground potential,.

Another object of the present invention is to provide a semiconductor device including the transistor output circuit and a switching electric power unit provided with the transistor output circuit.

The present invention provides a transistor output circuit having: a pre-driving circuit having a first CMOS circuit driven by an input signal, which is connected between an electric power unit and a ground; a main driving circuit having an NPN-type transistor and a PNP-type transistor driven by an output of the pre-driving circuit, which are connected between the electric power unit and the ground in series, and outputting an output signal from a series connection point of the NPN-type transistor and the PNP-type transistor; and an auxiliary driving circuit having a second CMOS circuit driven by the input signal and a current limit resistor for limiting an output current of the second CMOS circuit, which are connected between the electric power unit and the ground, wherein an output point of the auxiliary driving circuit is connected to the series connection point.

Furthermore, the pre-driving circuit includes a first resistor, a second resistor, and the first CMOS circuit having a PMOS and a NMOS, in which the PMOS, the first resistor, the second resistor, and the NMOS are connected in this order between the electric power unit and the ground in series, and outputs from a connection point of the first resistor and the second resistor, and the current limit resistor of the auxiliary driving circuit includes a first current limit resistor and a second current limit resistor, the second CMOS circuit includes a PMOS and an NMOS , in which the PMOS, the first current limit resistor, the second current limit resistor, and the NMOS are connected in this order between the electric power unit and the ground in series, and the auxiliary driving circuit outputs from a connection point of the first current limit resistor and the second current limit resistor. Furthermore, at least one of the first current limit resistor and the second current limit resistor has a plurality of resistor elements in series and/or parallel.

Furthermore, a control transistor controlled to be turned on and off by the output signal.

The present invention provides a semiconductor integrated circuit having the transistor output circuit.

The present invention provides a switching electric power unit having: a transistor output circuit including a pre-driving circuit having a first CMOS circuit driven by an input signal, which is connected between an electric power unit and a ground; a main driving circuit having an NPN-type transistor and a PNP-type transistor driven by an output of the pre-driving circuit, which are connected between the electric power unit and the ground in series, and outputting an output signal being outputted from the a series connection point of the NPN-type transistor and the PNP-type transistor; and an auxiliary driving circuit having a second CMOS circuit driven by the input signal and also having a current limit resistor for limiting an output current of the second CMOS circuit, which are connected between the electric power unit and the ground, wherein an output point of the auxiliary driving circuit is being connected to the series connection point; and a main circuit section, which includes a control transistor controlled to be turned on and off by the output signal from the transistor output circuit, outputting an output signal which voltage is converted from a voltage of the electric power unit according to the operation of turning on and off of the control transistor.

Furthermore, the pre-driving circuit includes a first resistor, a second resistor, and the first CMOS circuit having a PMOS and a NMOS, in which the PMOS, the first resistor, the second resistor, and the NMOS are connected in this order between the electric power unit and the ground in series, and outputs from a connection point of the first resistor and the second resistor, and the current limit resistor of the auxiliary driving circuit includes a first current limit resistor and a second current limit resistor, the second CMOS circuit includes a PMOS and an NMOS, in which the PMOS, the first current limit resistor, the second current limit resistor, and the NMOS are connected in this order between the electric power unit and the ground in series, and the auxiliary driving circuit outputs from a connection point of the first current limit resistor and the second current limit resistor.

DETAILED DESCRIPTION OF THE PREFERRED EMBODIMENTS

Figure 1:
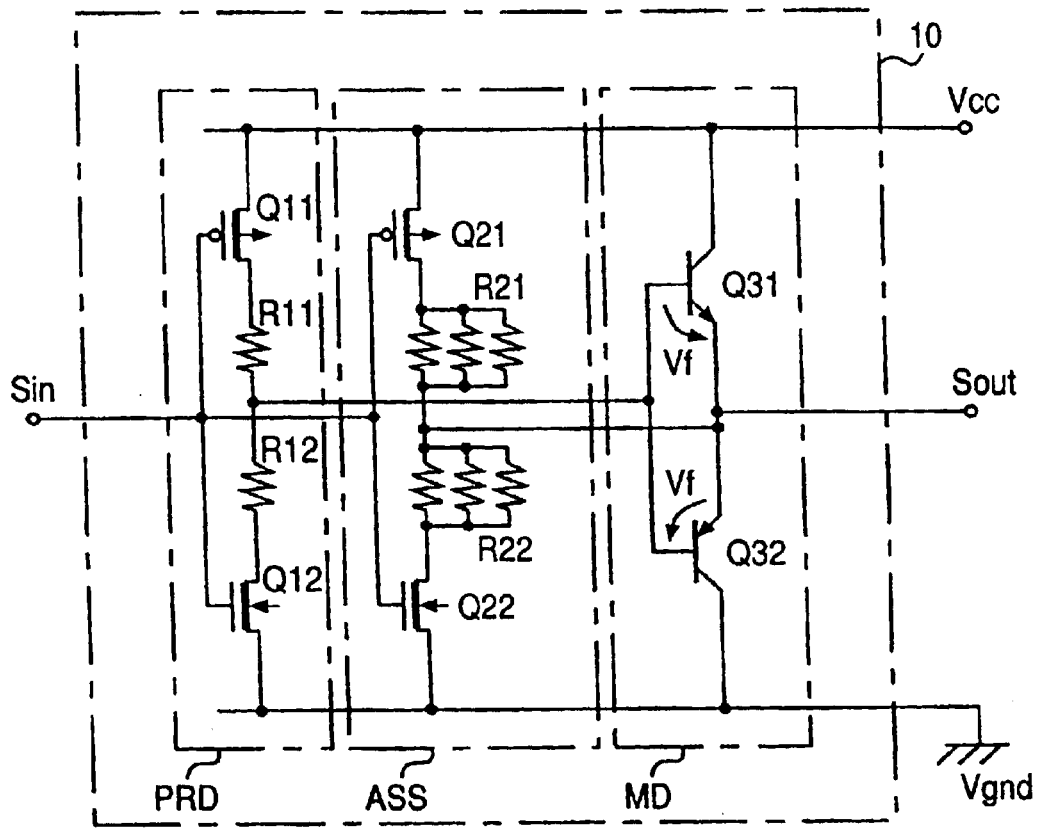
FIG. 1 is a constitution view of the transistor output circuit of the first embodiment of the present invention.

Referring to the drawings, explanations will be made as follows into a transistor output circuit, a semiconductor device having the transistor output circuit and a switching electric power unit having the transistor output circuit of the present invention.

Figure 2:
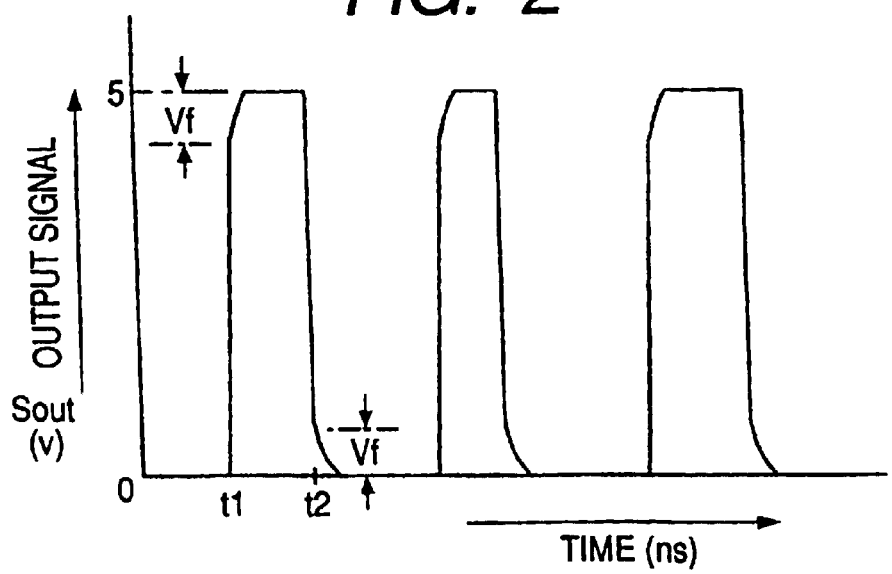
FIG. 2 is a wave-form diagram of the output signal of the transistor output circuit shown in FIG. 1.

FIG. 1 is a view showing an constitution of a transistor output circuit 10 of an embodiment of the present invention. FIG. 2 is a view showing a wave-form of a output signal $S_{out}$.

As shown in FIG. 1, the transistor output circuit 10 includes a pre-driving circuit (pre-driver) PRD, an auxiliary driving circuit (assist circuit) ASS, and a main driving circuit (main driver) MD.

Pre-driver PRD includes a P-type MOSFET (hereinafter, PMOS) Q11, a resistor R11, a resistor R12, and an N-type MOSFET (hereinafter, NMOS) Q12 which are connected in series between a electric power unit (power-supply potential $V_{cc}$) and a ground (ground potential $V_{gnd}$). The PMOS Q11 and the NMOS Q12 configure a first CMOS circuit, and input signal $S_{in}$, in which high level (H) and low level (L) are alternately repeated, is supplied to each gate of the PMOS Q11 and the NMOS Q12. An output of the pre-driver PRD is obtained from a connection point of the resistor R11 and the resistor R12. Since the resistor R11 and the resistor R12 are connected in series between the PMOS Q11 and the NMOS Q12, these resistors work as current limit resistors to limit a short circuit current flowing in the first CMOS circuit and also to limit a value of a current outputted from the pre-driver PRD.

Figure 3:
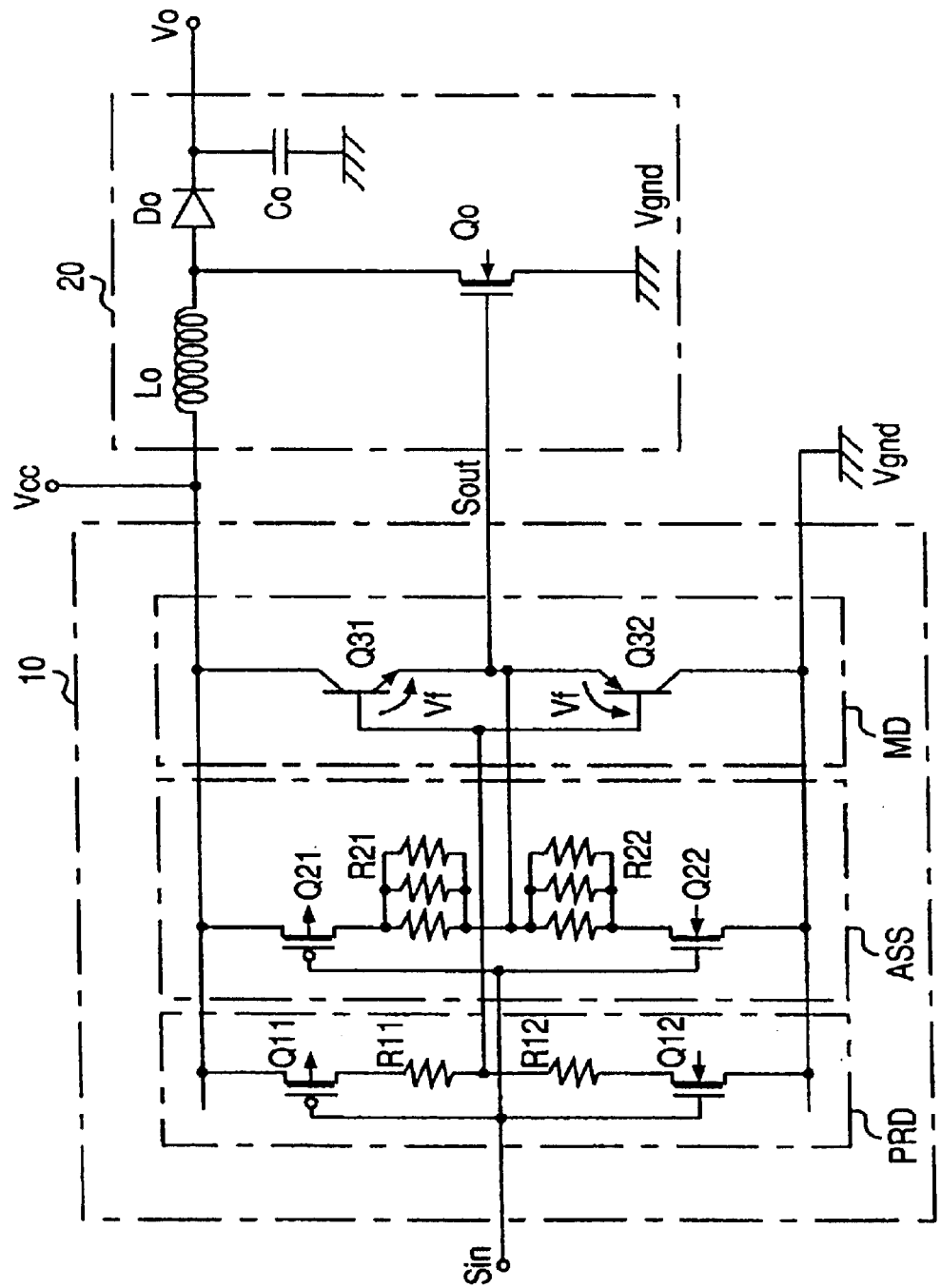
FIG. 3 is a constitution view of the switching electric power unit of the second embodiment of the present invention.
Figure 4:
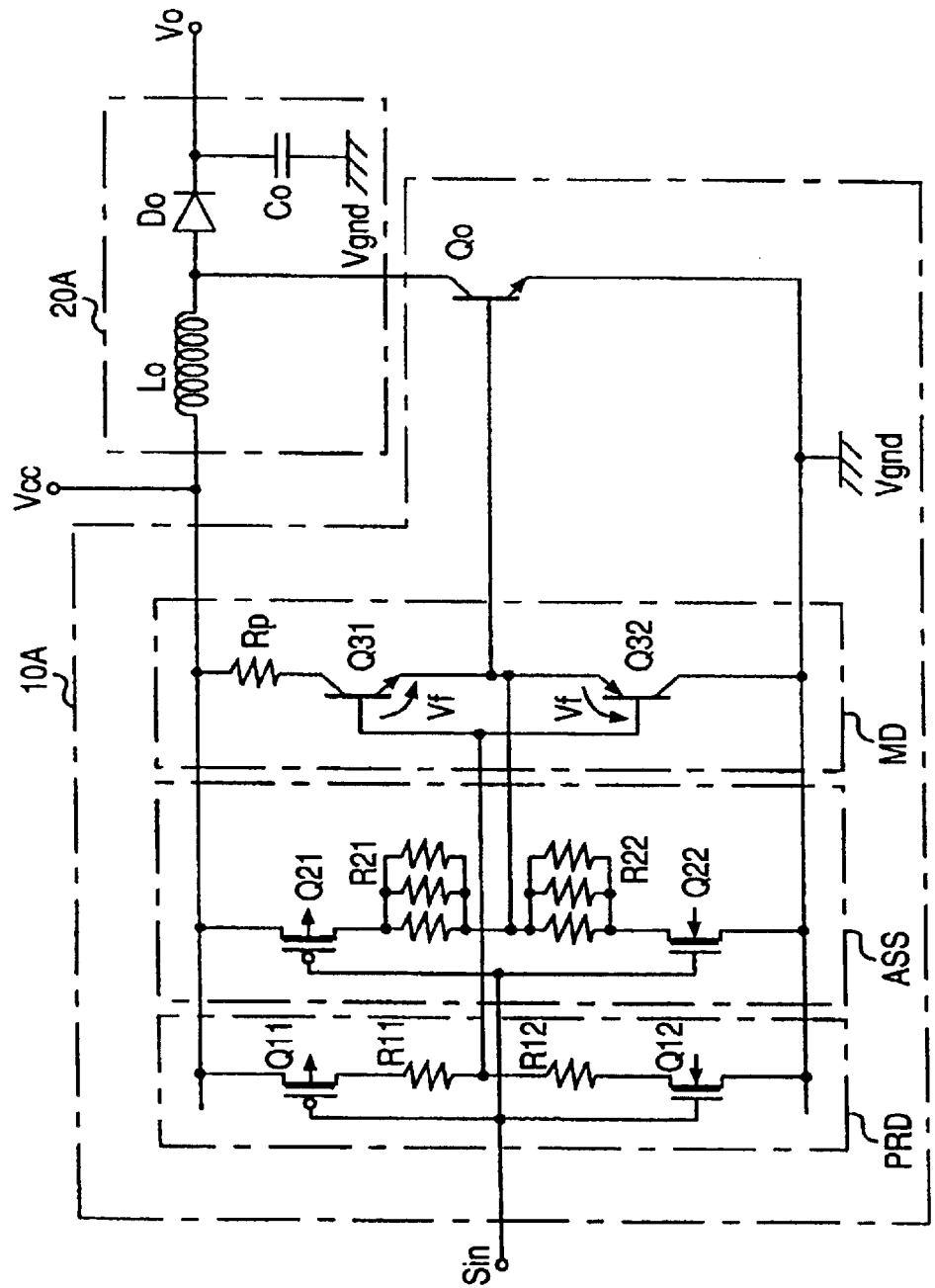
FIG. 4 is a constitution view of the switching electric power unit of the third embodiment of the present invention.
Figure 5:
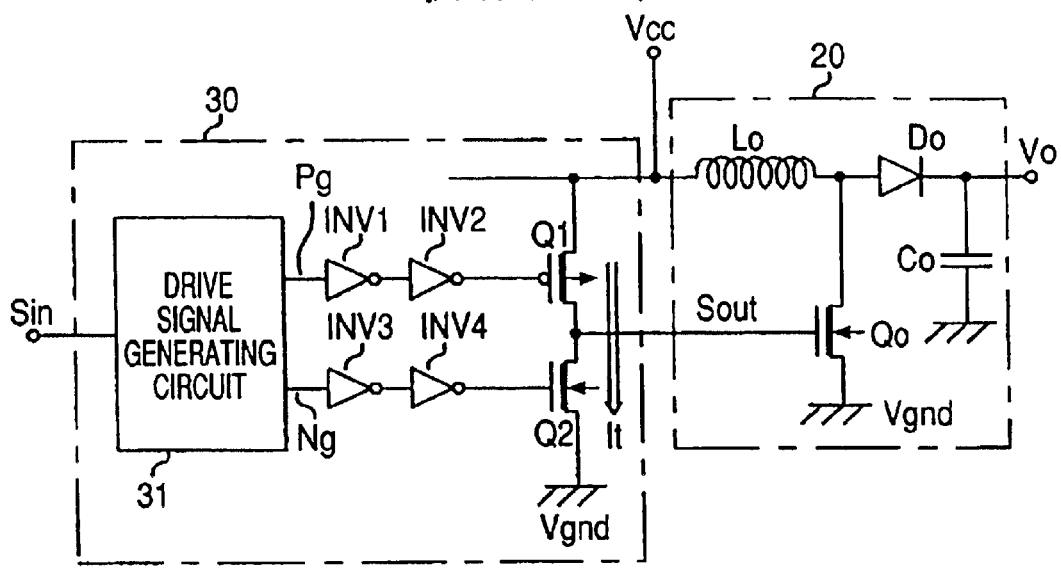
FIG. 5 is a constitution view of the conventional switching electric power unit.
Figure 6:
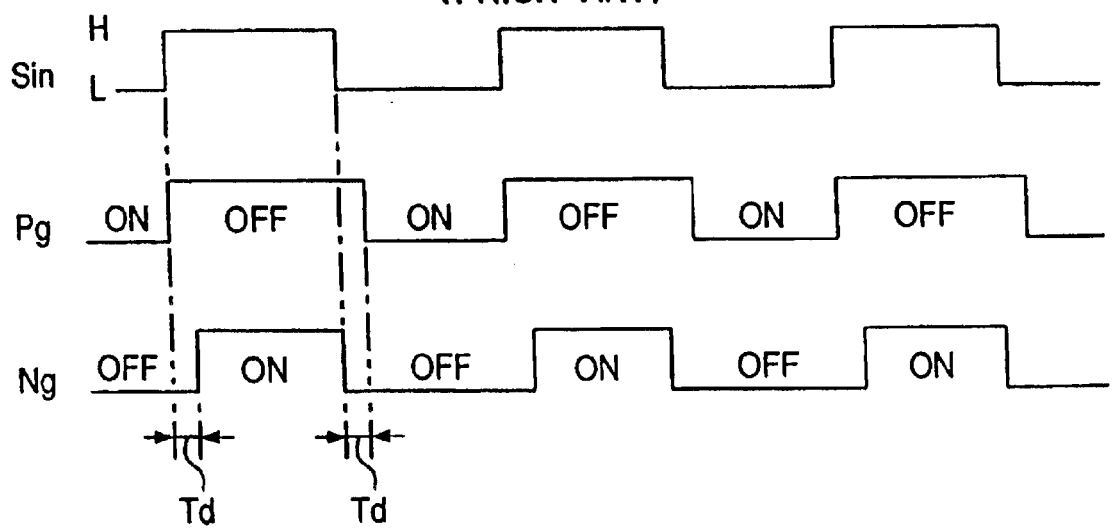
FIG. 6 is a timing chart of the drive signal shown in FIG. 5.

The assist circuit ASS is a circuit to assist a driving capacity of main driver MD. The assist circuit ASS includes a PMOS Q21, a first current limit resistor R21, a second current limit resistor R22, and an NMOS Q22 which are connected in series between the electric power unit and the ground. The PMOS Q21 and the NMOS Q22 configure a second CMOS circuit, and input signal $S_{in}$ is supplied to each gate of the PMOS Q21 and the NMOS Q22. An output of the assist circuit ASS is obtained from a connection point of the first current limit resistor R21 and the second current limit resistor R22. The first current limit resistor R21 and the second current limit resistor R22 adjust a capacity for assisting a driving capacity of the main driver MD. In order to adjust each resistance value of the first current limit resistor R21 and the second current limit resistor R22, a plurality of resistor elements are connected in series and/or parallel in each current limit resistor R21, R22. In FIGS. 1, 3 and 4, an example in which three resistor elements are connected in parallel is shown. Since the first current limit resistor R21 and the second current limit resistor R22 are connected in series between the PMOS Q21 and the NMOS Q22, these resistors work as current limit resistors to limit a short circuit current flowing in the second CMOS circuit.

Further, the assist circuit ASS assists the driving capacity of the main driver MD to increase the output signal $S_{out}$ to the power-supply potential $V_{cc}$ or to decrease the output signal $S_{out}$ to the ground potential $V_{gnd}$.

The main driver MD includes an NPN-type bipolar transistor (hereinafter, NPN) Q31 and a PNP-type bipolar transistor (hereinafter, PNP) Q32 which are connected in series between the electric power unit and the ground. An output of the pre-driver PRD is supplied to the bases of the NPN Q31 and the PNP Q32 in common. According to that the output is High level or Low level, either the NPN Q31 or the PNP Q32 conducts.

A series connection point of the NPN Q31 and the PNP Q32 is connected to an output terminal of the transistor output circuit 10 and outputs the output signal $S_{out}$. The output signal $S_{out}$ is supplied to a load, which is connected outside, such as a capacitor or a control transistor.

An output of the assist circuit ASS is supplied to the series connection point of the NPN Q31 and the PNP Q32 or to the output terminal of the transistor output circuit 10. Therefore, the output from the assist circuit ASS is added to the output from the main driver MD to be the output signal $S_{out}$.

The transistor output circuit 10 including the pre-driver PRD, the assist circuit ASS and the main driver MD is formed as a semiconductor integrated circuit device (IC).

Referring to FIG. 2, operation of the transistor output circuit 10 shown in FIG. 1 will be explained below. The input signal $S_{in}$ is supplied from a control circuit (not shown) as a high/low level signal having a pulse width according to a control state like PWM signal.

When the input signal $S_{in}$ is high level state, the PMOS Q11 of the pre-driver PRD is turned-off state and the NMOS Q12 is turned-on state. Therefore, the pre-driver PRD supplies a low level signal to the main driver MD. Accordingly, the NPN Q31 of the main driver MD is turned off and the PNP Q32 is turned on. In order to turn on the PNP Q32, it is necessary to supply a predetermined forward voltage $V_f$ between the emitter and the base. Therefore, even when a level of a signal inputted into the base is the ground potential $V_{gnd}$, the potential of the emitter, that is, the output signal $S_{out}$ does not decrease to a value not less than the forward voltage $V_f$.

However, since the input signal $S_{in}$ is high level state at this time, the PMOS Q21 of the assist circuit ASS is turned-off state and the NMOS Q22 is turned-on state. Since a sufficiently high potential is applied to the gate of the NMOS Q22, the NMOS Q22 is completely turned on, and an intensity of a flowing current is very low. Accordingly, an output potential of the assist circuit ASS substantially becomes zero, so that the output signal $S_{out}$ is decreased to the ground potential $V_{gnd}$.

Next, when the input signal $S_{in}$ changes from high level to low level (t1 in FIG. 2), at first, the NMOS Q12 transits from the ON state to the OFF state, and the PMOS Q11 transits from the OFF state to the ON state. In this process of transition, both the PMOS Q11 and the NMOS Q12 are in conduction to cause timing in which the short circuit current flows. However, since the resistors R11 and R12 are connected in series, an intensity of the short circuit current is limited. The resistors R11 and R12 also work as current limit resistors for limiting base current of the NPN Q31 and the PNP Q32, which are of the current drive type, not to be too high.

In the progress of this transition state, the base potentials of the NPN Q31 and the PNP Q32 are increased, the PNP Q32 is turned off, and the voltage between base and emitter of the NPN Q31 exceeds the forward voltage $V_f$, so that the NPN Q31 is turned on. When the state of transition progresses and the base potentials of the NPN Q31 and the PNP Q32 increase to the power-supply potential $V_{cc}$, the output signal $S_{out}$ suddenly rises to a potential "$V_{cc}-V_f$" that is lower than the power-supply potential $V_{cc}$ by the forward voltage $V_f$.

The NPN Q31 and the PNP Q32 are connected in series and controlled by same input signal. Therefore, as both are not simultaneously turned on under the operational principle, no short circuit current essentially flows. Accordingly, there is no possibility that the switching frequency is limited by the short circuit current.

However, when the main driver MD having the NPN Q31 and the PNP Q32 is only used, the upper limit and lower limit of an amplitude of the output signal $S_{out}$ are limited by the forward voltage $V_f$. In the present invention, since the assist circuit ASS is provided, the problem that the amplitude of the output signal $S_{out}$ is limited can be solved, and a change in an output can be smoothed. In this way, electromagnetic noise interference reduces in respect of EMI.

In the assist circuit ASS, when the input signal $S_{in}$ changes from high level to low level (t1 in FIG. 2), the NMOS Q22 transits from the ON state to the OFF state, and the PMOS Q21 transits from the OFF state to the ON state. In this process of transition, both the PMOS Q21 and the NMOS Q22 are in conduction to cause timing in which the short circuit current flows. However, since the first current limit resistor R21 and the second current limit resistor R22 are connected in series, an intensity of the short circuit current is limited.

In the progress of this transition state, since a circuit in which the PMOS Q21 and the first current limit resistor R21 are connected in series is connected to the NPN Q31 in parallel, the assist circuit ASS outputs little current, and most of a current forming the output signal $S_{out}$ is supplied from the main driver MD. Accordingly, the output signal $S_{out}$ suddenly rises. When the output signal $S_{out}$ reaches an potential that is lower than the power-supply potential $V_{cc}$ by the forward voltage $V_f$, the current supplied from the NPN Q31 is stopped.

At this time, the PMOS Q21 of the assist circuit ASS is completely turned-on state. Therefore, the output signal $S_{out}$ gradually increases according to a current flowing via the first current limit resistor R21 and reaches the power-supply potential $V_{cc}$. In this meaning, the assist circuit ASS is an auxiliary driving circuit to softly assist.

Next, when the input signal $S_{in}$ changes from low level to high level (t2 in FIG. 2), in the same manner, the output signal $S_{out}$, which is at the power-supply potential $V_{cc}$, suddenly decreases from the power-supply potential $V_{cc}$ to the forward voltage $V_f$ by the main driver MD and then gradually decreases to the ground potential $V_{gnd}$ by the assist circuit ASS.

In the transistor output circuit 10, since BiCMOS circuit is used, no short circuit current generates in the main driver MD. In the pre-driver PRD and the assist circuit ASS, as the resistors R11, R12, R21 and R22 are respectively connected to CMOS circuit in series, an intensity of the short circuit current is remarkably reduced. Accordingly, it is possible to reduce electromagnetic noise caused by the short circuit current. Further, it is possible to increase the switching frequency from 0.5 to 1 MHz, which is conventional, to 10 to 12 MHz.

Furthermore, since the assist circuit ASS configured by CMOS is jointly used, the output signal $S_{out}$ can be increased and decreased to the power-supply potential $V_{cc}$ and the ground potential $V_{gnd}$, and the output signal $S_{out}$ can be smoothly changed near the upper limit and the lower limit. Therefore, an intensity of electromagnetic noise can be further reduced and it becomes possible to supply a switching output having a sufficiently large amplitude.

Since the NPN Q31 and the PNP Q32 of the main driver MD are respectively bipolar transistor, a required area of the transistor output circuit 10 in IC can be reduced as compared with MOS. Further, a tolerated quantity of electrostatic discharge damage can be improved.

The transistor output circuit 10 described above can be used for not only a switching electric power unit but also a device in which signals of high frequency of level H and level L are widely used, for example, the transistor output circuit 10 described above can be used for a controller.

FIG. 3 is a view showing an constitution of the switching electric power unit of an embodiment of the present invention. This view shows an example of a switching electric power unit including the transistor output circuit 10 shown in FIG. 1 and a main circuit 20. The main circuit 20 has a control transistor $Q_o$, a inductor $L_o$, a diode $D_o$, and a capacitor $C_o$.

In the switching electric power unit, when the control transistor $Q_o$ is turned on and off by the output signal $S_{out}$ from the transistor output circuit 10, energy is accumulated in and discharged from the inductor $L_o$, so that a high voltage can be obtained. The obtained high voltage is rectified by the diode $D_o$ and smoothed by the capacitor $C_o$ so as to obtain DC output voltage $V_o$. The DC output voltage $V_o$ is subjected to a constant-voltage control, in which feedback voltage obtained by dividing the DC output voltage $V_o$ is compared with a reference voltage (setting voltage) and the pulse width of the input signal $S_{in}$ is subjected to a PWM control according to the error. Concerning the transistor $Q_o$, not only NMOS but also PMOS or electronic switches such as NPN and PNP can be used.

In this connection, the main circuit 20 shown in FIG. 3 is a simple example. It can be widely applied to devices, by which an output voltage can be obtained when an electric power unit voltage is converted into the output voltage by the switching operation of ON and OFF, such as a step-down type switching electric power unit, a switching electric power unit using a transformer, a charge pump type switching device and the like.

In the switching electric power unit, the control transistor $Q_o$ can be switched at a high frequency by the output signal $S_{out}$ of the transistor output circuit 10. Therefore, the sizes of the inductor $L_o$ of the main circuit 20 and the other components can be reduced. Accordingly, the size of the entire switching electric power unit can be reduced.

FIG. 4 is a view showing an constitution of the switching electric power unit of another embodiment of the present invention.

A transistor output circuit 10A shown in FIG. 4 includes a control transistor $Q_o$. In this case, the pre-driver PRD, the assist circuit ASS, the main driver MD and the control transistor $Q_o$ are formed as a semiconductor integrated circuit device. In this case, compared with the main circuit section 20, a main circuit section 20A includes components except for the control transistor $Q_o$.

In the case shown in FIG. 4, the control transistor $Q_o$ is NPN-type bipolar transistor. In the case where a current drive type transistor such as NPN or PNP is used, a protective resistor $R_p$ for limiting a base current, which is a drive current of the transistor, is provided in the drive current route. This switching electric power unit shown in FIG. 4 can provide the same effect as that of the device shown in FIG. 3.

As explained above, the short circuit current is remarkably reduced by using BiCMOS circuit. Therefore, it is possible to reduce electromagnetic noise caused by the short circuit current. It is also possible to remarkably increase the switching frequency compared with the conventional one.

Furthermore, since the assist circuit ASS configured by CMOS is jointly used, the output signal $S_{out}$ can be increased and decreased to the power-supply potential $V_{cc}$ (upper limit) and the ground potential $V_{gnd}$ (lower limit), and the output signal $S_{out}$ can be smoothly changed near the power-supply potential $V_{cc}$ and the ground potential $V_{gnd}$. Therefore, an intensity of electromagnetic noise can be further reduced and it becomes possible to supply a switching output having a sufficiently large amplitude.

In the switching electric power unit explained above, since the control transistor $Q_o$ is switched at a high frequency, the size of the main circuit 20, 20A can be reduced. Accordingly, the size of the entire switching electric power unit can be reduced.

What is claimed is:

1. A transistor output circuit comprising:
    a pre-driving circuit having a first CMOS circuit driven by an input signal, which is connected between an electric power unit and a ground;
    a main driving circuit having an NPN-type transistor and a PNP-type transistor driven by an output of the pre-driving circuit, which-are connected between the electric power unit and the ground in series, and outputting an output signal from a series connection point of the NPN-type transistor and the PNP-type transistor; and
    an auxiliary driving circuit having a second CMOS circuit driven by the input signal and a current limit resistor for limiting an output current of the second CMOS circuit, which are connected between the electric power unit and the ground, wherein an output point of the auxiliary driving circuit is connected to the series connection point.

2. The transistor output circuit according to claim 1, wherein
    the pre-driving circuit includes a first resistor, a second resistor, and the first CMOS circuit having a PMOS and a NMOS, in which the PMOS, the first resistor, the second resistor, and the NMOS are connected in this order between the electric power unit and the ground in series, and outputs from a connection point of the first resistor and the second resistor, and
    the current limit resistor of the auxiliary driving circuit includes a first current limit resistor and a second current limit resistor, the second CMOS circuit includes a PMOS and an NMOS, in which the PMOS, the first current limit resistor, the second current limit resistor, and the NMOS are connected in this order between the electric power unit and the ground in series, and the auxiliary driving circuit outputs from a connection point of the first current limit resistor and the second current limit resistor.

3. The transistor output circuit according to claim 2, wherein
    at least one of the first current limit resistor and the second current limit resistor has a plurality of resistor elements in series and/or parallel.

4. The transistor output circuit according to claim 1, further comprising:
    a control transistor controlled to be turned on and off by the output signal.

5. A semiconductor integrated circuit comprising the transistor output circuit described in claim 1.

6. A switching electric power unit comprising:
    a transistor output circuit including a pre-driving circuit having a first CMOS circuit driven by an input signal, which is connected between an electric power unit and a ground; a main driving circuit having an NPN-type transistor and a PNP-type transistor driven by an output of the pre-driving circuit, which are connected between the electric power unit and the ground in series, and outputting an output signal being outputted from the a series connection point of the NPN-type transistor and the PNP-type transistor; and an auxiliary driving circuit having a second CMOS circuit driven by the input signal and also having a current limit resistor for limiting an output current of the second CMOS circuit, which are connected between the electric power unit and the ground, wherein an output point of the auxiliary driving circuit is being connected to the series connection point; and a main circuit section, which includes a control transistor controlled to be turned on and off by the output signal from the transistor output circuit, outputting an output signal which voltage is converted from a voltage of the electric power unit according to the operation of turning on and off of the control transistor.

7. The switching electric power unit according to claim 6, wherein the pre-driving circuit includes a first resistor, a second resistor, and the first CMOS circuit having a PMOS and a NMOS, in which the PMOS, the first resistor, the second resistor, and the NMOS are connected in this order between the electric power unit and the ground in series, and outputs from a connection point of the first resistor and the second resistor, and the current limit resistor of the auxiliary driving circuit includes a first current limit resistor and a second current limit resistor, the second CMOS circuit includes a PMOS and an NMOS, in which the PMOS, the first current limit resistor, the second current limit resistor, and the NMOS are connected in this order between the electric power unit and the ground in series, and the auxiliary driving circuit outputs from a connection point of the first current limit resistor and the second current limit resistor.

* * * * *